United States Patent
Wei et al.

(10) Patent No.: US 10,658,149 B1
(45) Date of Patent: May 19, 2020

(54) ION SOURCE HEAD STRUCTURE OF SEMICONDUCTOR ION IMPLANTER

(71) Applicant: Powerchip Semiconductor Manufacturing Corporation, Hsinchu (TW)

(72) Inventors: Yi-Cheng Wei, Hsinchu (TW); Kun-Shu Huang, Taoyuan (TW); Wen-Hao Lin, Hsinchu (TW); Ta-Chen Hsu, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/373,656

(22) Filed: Apr. 3, 2019

(30) Foreign Application Priority Data

Feb. 22, 2019 (TW) .............................. 108106107 A (51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/061* (2013.01)

(58) Field of Classification Search
CPC ... H01J 37/08; H01J 37/3171; H01J 2237/061
USPC ......... 250/423 R, 424, 492.1, 492.2, 492.21, 250/492.22, 492.23, 492.3
See application file for complete search history.

(56) References Cited

U.S. PATENT DOCUMENTS

| 8,319,410 B2 | 11/2012 | Jerez | |
|---|---|---|---|
| 2012/0013249 A1* | 1/2012 | Jerez | H01J 27/08 313/613 |
| 2012/0252195 A1* | 10/2012 | Jones | H01J 37/08 438/514 |

(Continued)

FOREIGN PATENT DOCUMENTS

| TW | 373244 | 11/1999 |
|---|---|---|
| TW | 200743133 | 11/2007 |
| TW | M374647 | 2/2010 |

(Continued)

OTHER PUBLICATIONS

"Office Action of Taiwan Counterpart Application," dated Oct. 2, 2019, p. 1-p. 6.

*Primary Examiner* — Nicole M Ippolito
(74) *Attorney, Agent, or Firm* — JCIPRNET (57) ABSTRACT

An ion source head structure of a semiconductor ion implanter including a filament, a filament clamp, a cathode, a cathode clamp, an insulation assembly is provided. The filament clamp clamps the filament. The cathode presents a shell shape and has a receiving space. The filament is located in the receiving space. The cathode clamp clamps the cathode. The insulation assembly is disposed between the filament clamp and the cathode clamp such that the filament clamp is insulated from the cathode clamp. The insulation assembly has a first surface, a second surface opposite to the first surface, and an outer surface between the first surface and the second surface, wherein the first surface of the insulation assembly is in contact with the filament clamp, and the second surface of the insulation assembly is in contact with the cathode clamp. A step difference exists on the outer surface of the insulation assembly.

10 Claims, 6 Drawing Sheets

(56) References Cited

U.S. PATENT DOCUMENTS

2016/0351379 A1* 12/2016 Sato .................. H01J 37/32669

FOREIGN PATENT DOCUMENTS

| TW | 201545196 | 12/2015 |
| WO | 03075305 | 9/2003 |
| WO | 2017117053 | 7/2017 |

* cited by examiner

ION SOURCE HEAD STRUCTURE OF SEMICONDUCTOR ION IMPLANTER

CROSS-REFERENCE TO RELATED APPLICATION

This application claims the priority benefit of Taiwan application serial no. 108106107, filed on Feb. 22, 2019. The entirety of the above-mentioned patent application is hereby incorporated by reference herein and made a part of this specification.

BACKGROUND

Technical Field

The invention relates to an ion source head structure, and particularly relates to an ion source head structure of a semiconductor ion implanter.

Description of Related Art

Ion implanter is important process equipment for performing ion doping in fabrication of an integrated circuit, which includes an ion source head structure for converting a gas material or a solid material into an ion beam. The ion source head structure includes a filament and a cathode. The filament and the cathode are applied with different voltages. The filament produces hot electrons after being heated, and the hot electrons impact the cathode through the voltage difference to produce more evenly distributed hot electrons at the cathode. The hot electrons react with the gas material or the solid material in a chamber of the ion source head structure to generate ions. Since the filament and the cathode must be applied with different voltages to provide a stable source of the hot electrons, an insulation assembly has to be configured between a clamp of the cathode and a clamp of the filament to prevent loss of the voltage difference from conduction of the two clamps.

However, since the ion source head structure is placed in an ion chamber in operation, an inner surface of the ion chamber and an outer surface of each component of the ion source head structure are exposed to a distribution range of the ion beam, a layer of a charged film is deposited on the surface of the insulation assembly to cause loss of an insulating effect of the insulation assembly. Therefore, how to maintain the function of the ion source head structure for a long time partially depends on the timeliness of the insulation assembly.

SUMMARY

The invention is directed to an ion source head structure of a semiconductor ion implanter, which is adapted to prolong a time that an insulation assembly is completely covered by a charged film formed by an ion beam, so as to reduce an equipment and labor cost for replacing the insulation assembly.

The invention provides an ion source head structure of a semiconductor ion implanter including a filament, a filament clamp, a cathode, a cathode clamp and an insulation assembly. The filament clamp clamps the filament. The cathode presents a shell shape and has a receiving space. The filament is located in the receiving space. The cathode clamp clamps the cathode. The insulation assembly is disposed between the filament clamp and the cathode clamp such that the filament clamp is insulated from the cathode clamp. The insulation assembly has a first surface, a second surface opposite to the first surface, and an outer surface between the first surface and the second surface, wherein the first surface of the insulation assembly is in contact with the filament clamp, the second surface of the insulation assembly is in contact with the cathode clamp, and a step difference exists on the outer surface of the insulation assembly.

In an embodiment of the invention, the insulation assembly has an annular groove recessed on the outer surface to form the step difference.

In an embodiment of the invention, the annular groove is formed on the outer surface at a portion close to the second surface.

In an embodiment of the invention, the insulation assembly includes a first component and a second component, the first component has a bottom and an encircling wall extending from the bottom, and the second component is disposed on the bottom and located in the encircling wall, and a height of the second component is greater than a height of the encircling wall.

In an embodiment of the invention, the first surface of the insulation assembly is located on the first component, the second surface of the insulation assembly is located on the second component, and the annular groove is formed between the first component and the cathode clamp.

In an embodiment of the invention, a gap exists between a side surface of the second component and the encircling wall, and the gap is connected to the annular groove.

In an embodiment of the invention, the insulation assembly is an integrally formed structure.

In an embodiment of the invention, the insulation assembly further includes an insulation locking ring disposed in a perforation of the cathode clamp, and a locking member respectively and sequentially penetrates through the insulation locking ring, the insulation assembly and the filament clamp, and is at least screwed to the filament clamp.

In an embodiment of the invention, the insulation assembly includes a first component and a second component stacked on the first component, the second component has a through hole, and a part of the insulation locking ring is stretched into the through hole of the second component.

In an embodiment of the invention, the filament clamp has a first screw hole, the first component has a second screw hole corresponding to the first screw hole, and the insulation locking ring has a third screw hole corresponding to the second screw hole, and the locking member is respectively locked to the first screw hole, the second screw hole and the third screw hole.

Based on the above description, the ion source head structure of the semiconductor ion implanter of the invention includes the insulation assembly having the step difference, and the insulation assembly is clamped between the cathode clamp and the filament clamp, such that the ion beam generated by the ion source head structure of the semiconductor ion implanter does not easily fill the surface of the insulation assembly to cause a short-circuit problem. According to such design, a service life of the insulation assembly is prolonged, and meanwhile the equipment and labor cost for replacing the insulation assembly is reduced.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Embodiments are provided below with reference of accompanying drawings for detailed description of the invention, though the provided embodiments are not intended to be limiting of the invention. Moreover, the drawings are for illustrative purposes only and are not necessarily drawn to scale. For the sake of easy understanding, the same components in the following description will be denoted by the same symbols. In addition, the terms such as "including", "comprising", "having", etc., used in the specification are all open terms, which all refer to including but not limited to. Moreover, the directional terms, such as "top", "bottom" etc., are for the purpose of describing directions in the figures only and are not intended to be limiting of the invention.

Figure 1:
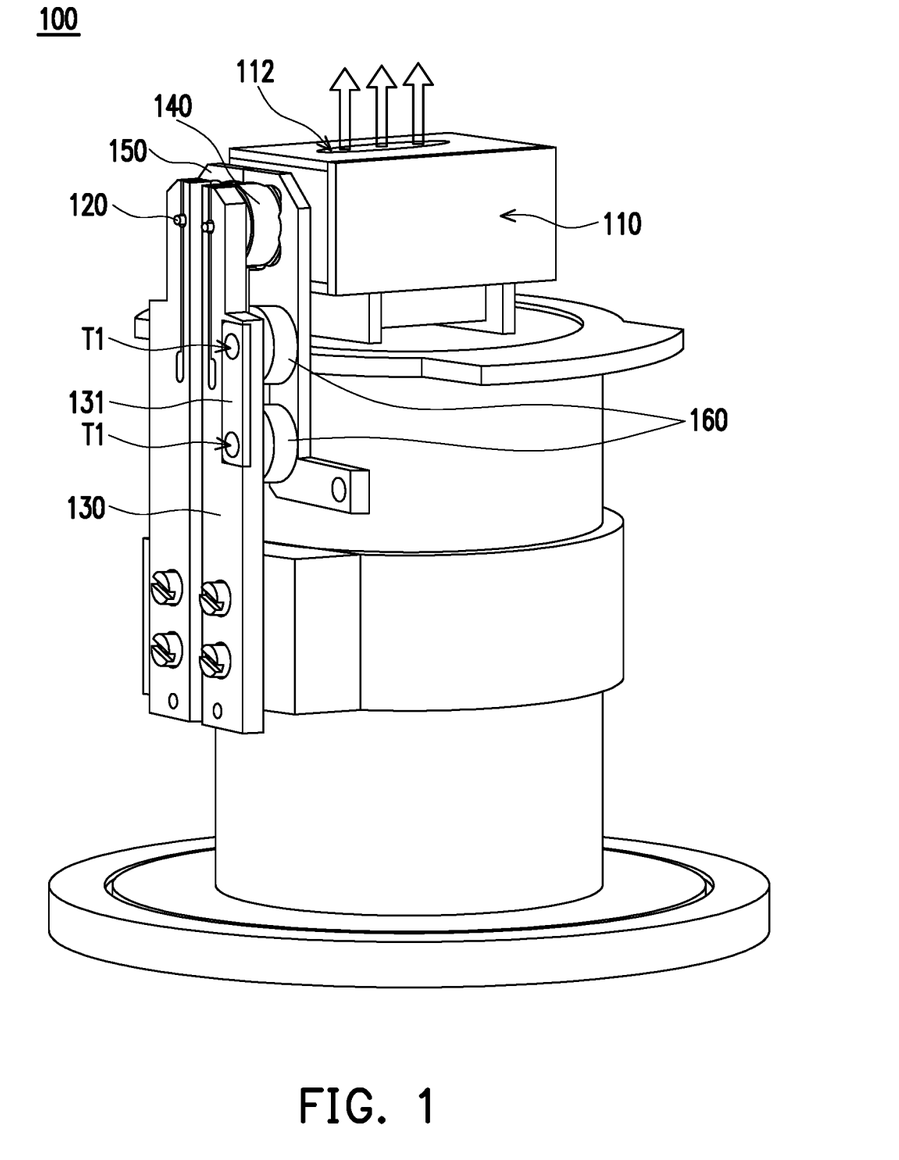
FIG. 1 is an ion source head structure of a semiconductor ion implanter according to an embodiment of the invention.
Figure 2:
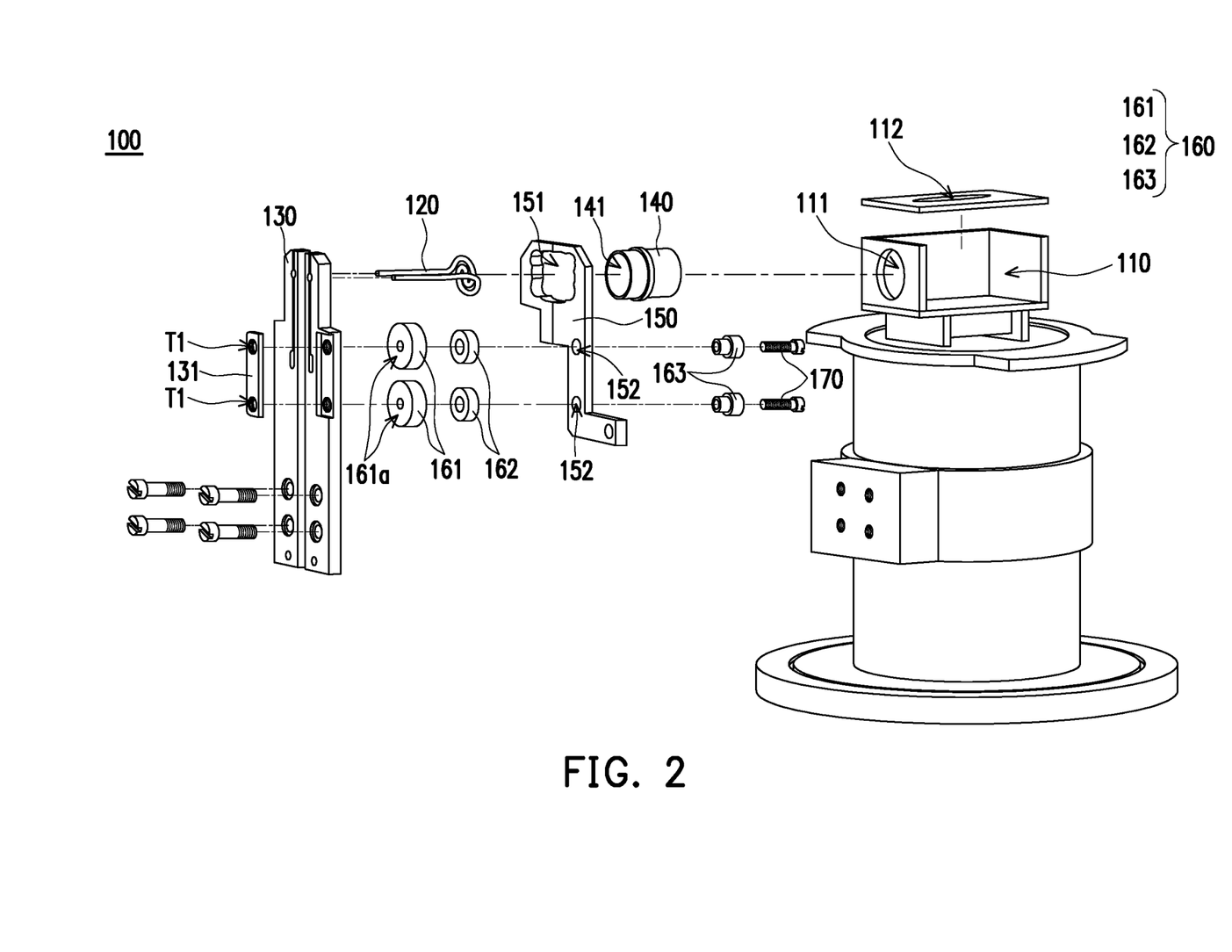
FIG. 2 is an exploded view of the ion source head structure of the semiconductor ion implanter of FIG. 1.

FIG. 1 is an ion source head structure of a semiconductor ion implanter according to an embodiment of the invention. FIG. 2 is an exploded view of the ion source head structure of the semiconductor ion implanter of FIG. 1. Referring to FIG. 1 and FIG. 2, the ion source head structure of the semiconductor ion implanter 100 of the invention includes a chamber 110, and the internal of the chamber 110 is adapted to be filled with a gas material or a solid material for producing a required ion beam in a subsequent manufacturing process. The ion source head structure of the semiconductor ion implanter 100 further includes a filament 120, a filament clamp 130, a cathode 140 and a cathode clamp 150. The filament clamp 130 clamps the filament 120 and is electrically connected to the filament 120. The cathode 140 presents a shell shape and has a receiving space 141, and is fixed in a groove 151 of the cathode clamp 150. The filament 120 and the cathode 140 are inserted into the chamber 110 through a hole 111 on the chamber 110. The filament 120 clamped by the filament clamp 130 is located in the receiving space 141, and there is a spacing distance between filament 120 and the cathode 140, such that the filament 120 and the cathode 140 do not contact with each other. The cathode clamp 150 clamps the cathode 140, and is electrically connected to the cathode 140. A material of the filament 120 is, for example, tungsten (W), and an outline of the filament 120 is, for example, a winding structure, such that the filament 120 may heat the cathode 140 more uniformly in a subsequent heating process, though the pattern of the filament 120 is not limited thereto.

When the ion source head structure of the semiconductor ion implanter 100 of the invention operates, the filament clamp 130 and the cathode clamp 150 are applied with different voltages. The filament 120 is conducted by a current of the filament clamp 130 and heated, and the heated filament 120 produces hot electrons. Moreover, since the voltage exerted to the filament 120 is different to the voltage exerted to the cathode 140 through the cathode clamp 150, the hot electrons are liable to impact the cathode 140 to generate more uniformly distributed hot electrons through a voltage difference. The hot electrons react with the gas material or the solid material in internal of the chamber 110 to produce ions, and the positively charged ions form an ion beam through an ion accelerator (not shown in the figure), and the ion beam exits from an aperture on the top of the chamber 110 to implement an ion doping process of the semiconductor manufacturing process.

In order to produce the evenly distributed hot electrons, the voltage difference between the filament 120 and the cathode 140 has to be maintained. Namely, the filament 120 and the cathode 140 must be maintained in a non-contacting state (i.e. the aforementioned spacing distance is maintained). In order to achieve such state, the filament clamp 130 and the cathode clamp 150 are adapted to be fixed to reduce an assembling deviation. However, the filament clamp 130 and the cathode clamp 150 must also be kept in the non-contacting state to maintain the voltage difference therebetween, so that an insulation assembly 160 must be set between the filament clamp 130 and the cathode clamp 150 to insulate the filament clamp 130 and the cathode clamp 150 while maintaining a close match state of the filament clamp 130 and the cathode clamp 150.

It should be noted that in the embodiment, the number of the insulation assemblies 160 is two, though the invention is not limited thereto, and a different number of the insulation assemblies 160 may be adopted according to an actual design of the ion source head structure of the semiconductor ion implanter 100.

Generally, the ion source head structure of the semiconductor ion implanter is located in an ion chamber (not shown in the figure) during the operation, and the ion beam produced by the ion source head structure of the semiconductor ion implanter is probably deposited on an inner wall of the ion chamber and an outer surface of the ion source head structure of the semiconductor ion implanter, so that a layer of charged film is deposited on a surface of the insulation assembly to cause loss of an insulating effect of the insulation assembly, and the ion source head structure of the semiconductor ion implanter is accordingly failed. In the embodiment, the insulation assembly 160 has a special structure, which is adapted to prolong a time that the insulation element 160 maintains the insulation state when the ion source head structure of the semiconductor ion implanter 100 operates, so as to increase a service life of the ion source head structure of the semiconductor ion implanter 100. The structure of any of the insulation assemblies 160 is described in detail below.

Figure 3:
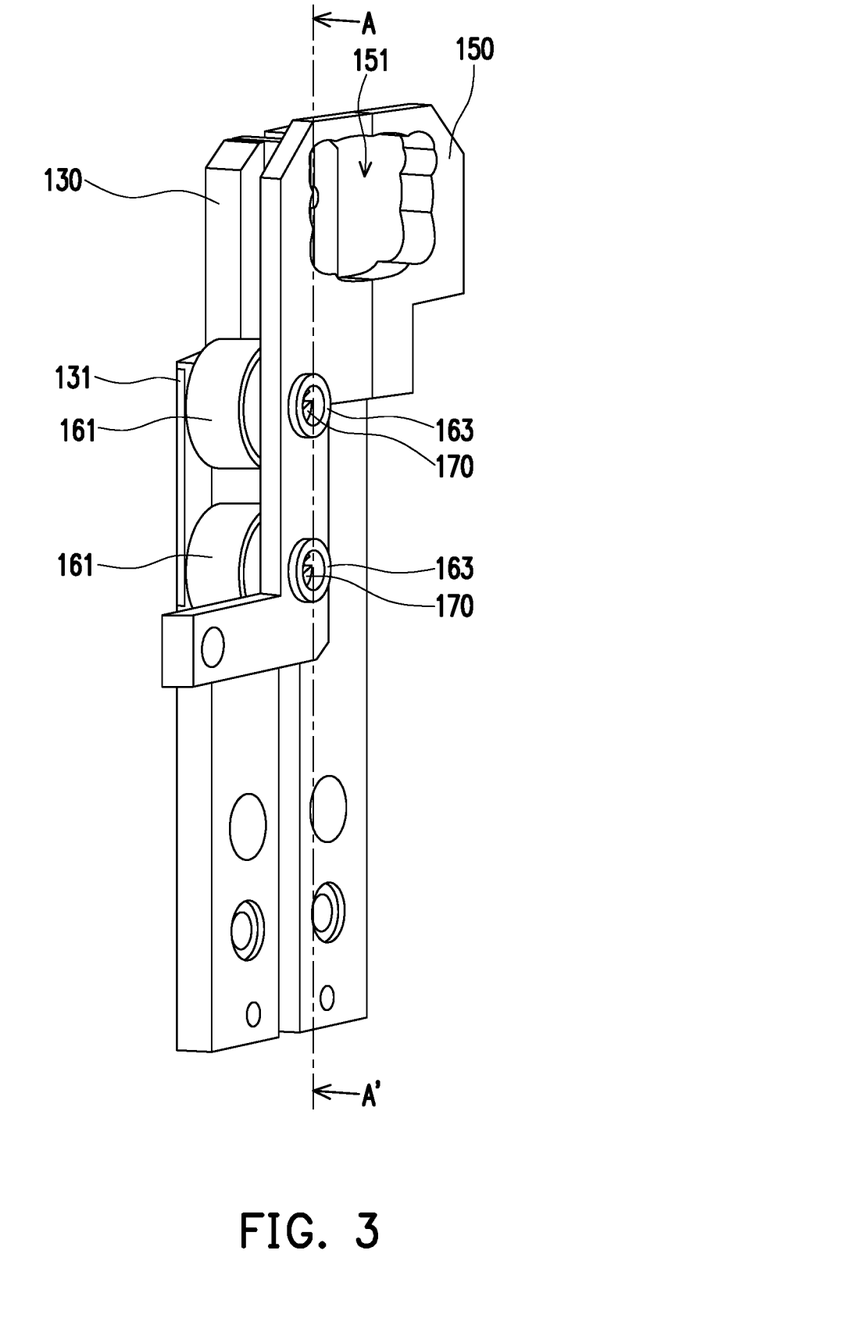
FIG. 3 is an enlarged view of a filament clamp, an insulation assembly and a cathode clamp of the ion source head structure of the semiconductor ion implanter of FIG. 1.
Figure 4:
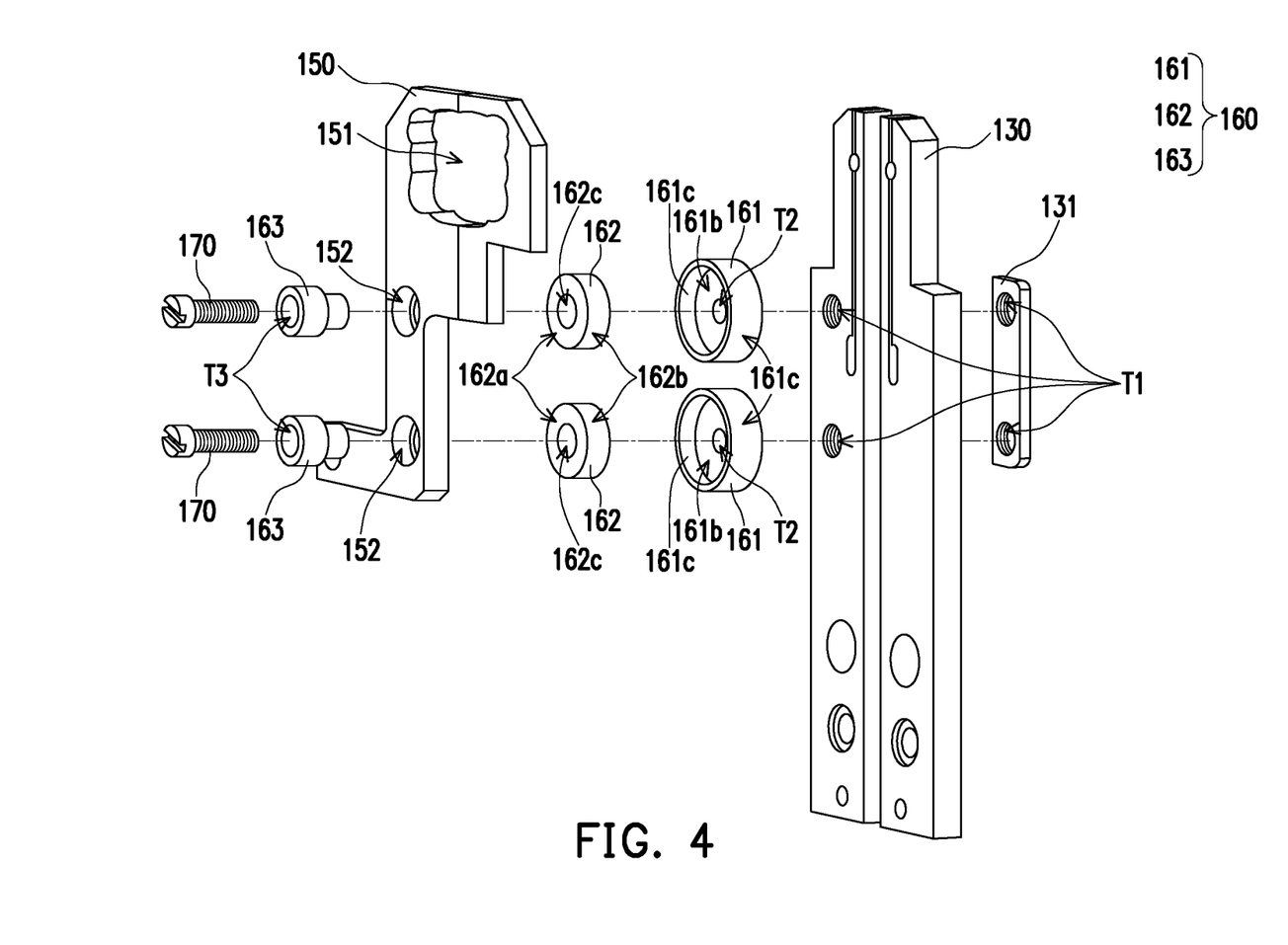
FIG. 4 is an exploded view of the filament clamp, the insulation assembly and the cathode clamp of the ion source head structure of the semiconductor ion implanter of FIG. 3.
Figure 5:
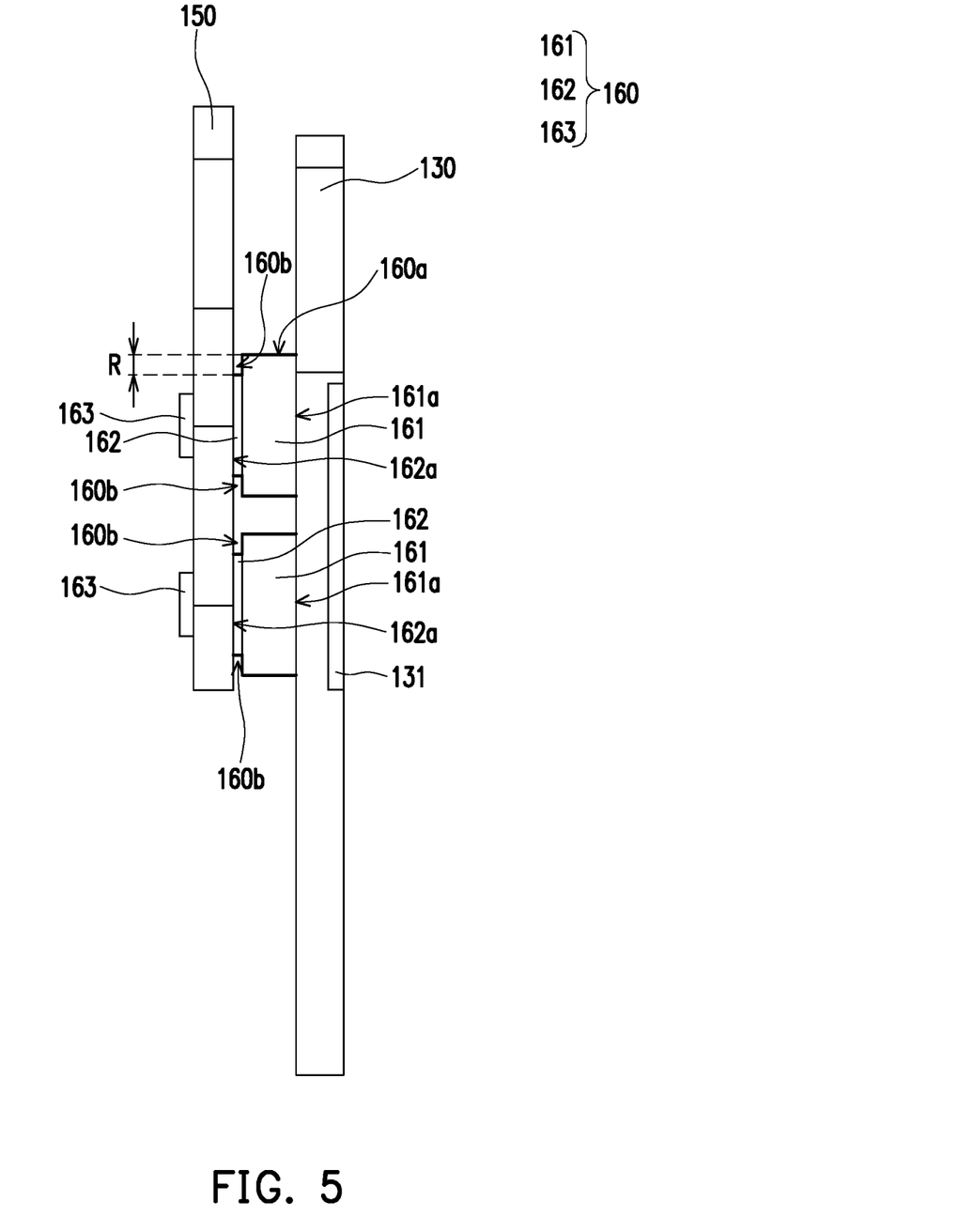
FIG. 5 is a side view of the filament clamp, the insulation assembly and the cathode clamp of the ion source head structure of the semiconductor ion implanter of FIG. 3.
Figure 6:
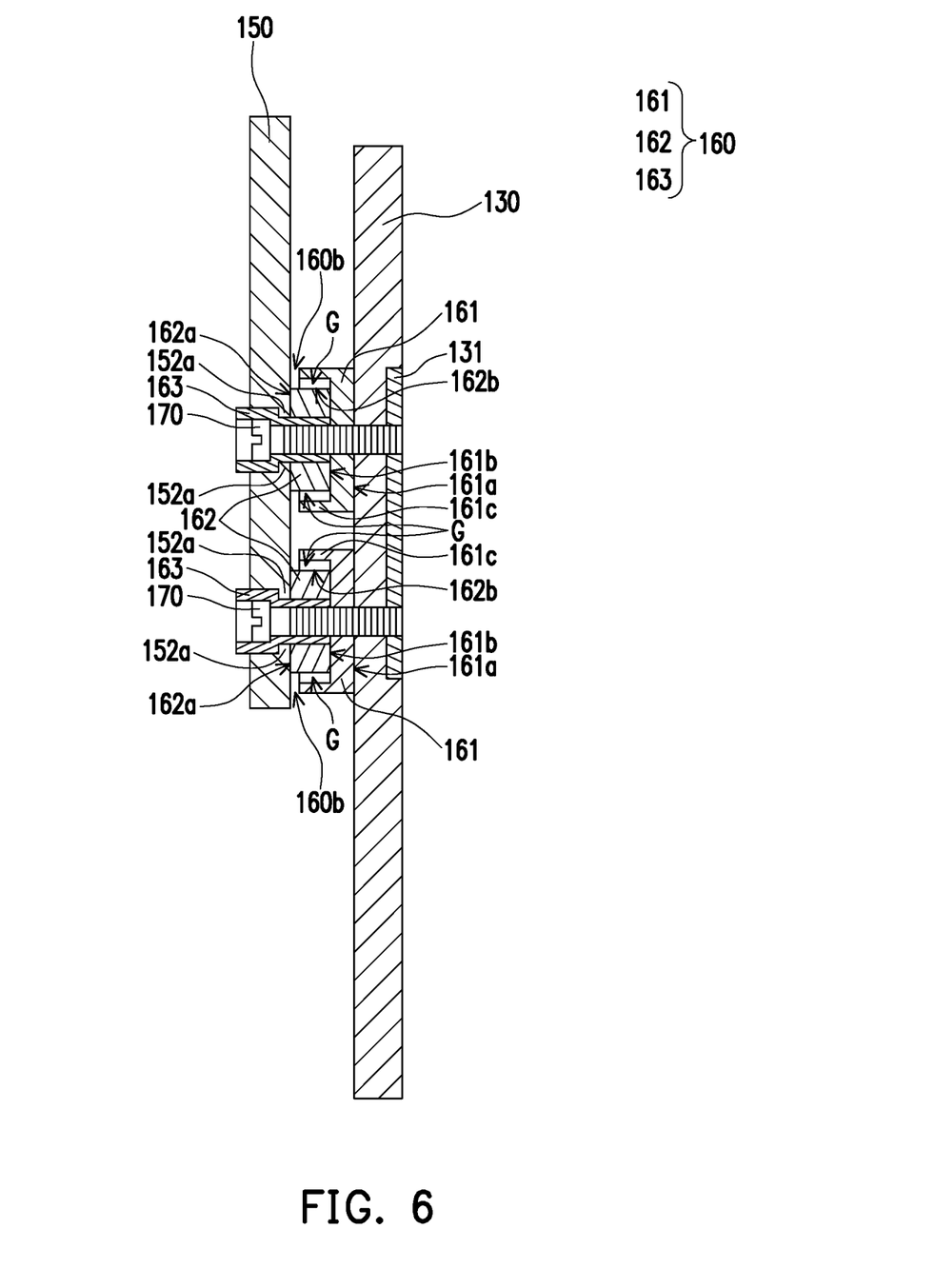
FIG. 6 is a cross-sectional view of the filament clamp, the insulation assembly and the cathode clamp of the ion source head structure of the semiconductor ion implanter of FIG. 3 along a section line A-A'.

FIG. 3 is an enlarged view of the filament clamp, the insulation assembly and the cathode clamp of the ion source head structure of the semiconductor ion implanter of FIG. 1. FIG. 4 is an exploded view of the filament clamp, the insulation assembly and the cathode clamp of the ion source head structure of the semiconductor ion implanter of FIG. 3. FIG. 5 is a side view of the filament clamp, the insulation assembly and the cathode clamp of the ion source head structure of the semiconductor ion implanter of FIG. 3. FIG. 6 is a cross-sectional view of the filament clamp, the insulation assembly and the cathode clamp of the ion source head structure of the semiconductor ion implanter of FIG. 3 along a section line A-A'.

In order to clearly describe an assembling relationship of the filament clamp, the insulation assembly and the cathode clamp, referring to FIG. 3 to FIG. 6 for the detailed description. In the embodiment, the insulation assembly 160 includes a first component 161 and a second component 162 combined with each other. As shown in FIG. 4, the first component 161 has a bottom 161b and a encircling wall 161c extending from the bottom 161b to form a concave structure. The second component 162 is configured as a cylindrical structure to contact the bottom 161b of the first component 161. As shown in FIG. 5 and FIG. 6, a height of the second component 162 in a direction perpendicular to a second surface 162a is greater than a height of the encircling wall 161c in a direction perpendicular to a first surface 161a, so that the second component 162 protrudes out of the first component 161.

In the embodiment, the first surface 161a of the first component 161 relative to the bottom 161b is used for contacting the filament clamp 130, and the second component 162 contacts the cathode clamp 150 through the second surface 162a protruding out of the encircling wall 161c and parallel to the bottom 161b. According to FIG. 5, it is clearly known that when the filament clamp 130, the insulation assembly 160 and the cathode clamp 150 are combined with each other, a part of a side surface 162b of the second component 162 and the encircling wall 161c of the first component 161 commonly form an outer surface 160a of the insulation assembly 160, and since a width of the second component 162 in a direction parallel to the second surface 162a is smaller than a width of an inner surface of the encircling wall 161c of the first component 161 in a direction parallel to the first surface 161a, a step difference R exists on the outer surface 160a of the insulation assembly 160. In other words, the insulation assembly 160 has an annular groove 160b recessed on the outer surface 160a and formed between the first component 161 and the cathode clamp 150 at a place close to the cathode clamp 150, so as to form the step difference R on the outer surface 160a of the insulation assembly 160.

During the operation of the ion source head structure of the semiconductor ion implanter 100, the ion beam extracted from the aperture 112 on the top of the chamber 110 may be deposited on a whole outer surface of the ion source head structure of the semiconductor ion implanter 100. If the outer surface 160a of the insulation assembly 160 is covered with a charged ion beam deposition film, the filament clamp 130 and the cathode clamp 150 are conducted to cause a short-circuit problem, such that the ion source head structure of the semiconductor ion implanter 100 is failed and cannot work. Through the aforementioned design of the step difference R, the ion beam is not easy to enter the annular groove 160b, so that a time that the ion beam is deposited on the whole outer surface of the insulation assembly 160 is prolonged. In other words, a frequency for replacing the insulation assemblies 160 is reduced to improve productivity.

However, the step difference R may also be formed by a plurality of discontinuous depressions on the insulation assembly 160. For example, the insulation assembly 160 may be an integrally formed structure, where when the insulation assembly 160 is formed through a Computer Numerical Control (CNC) tool machine, a plurality of depressions is processed on the outer surface of the insulation assembly 160 to produce discontinuity of the outer surface to prolong the time that the ion beam is deposited on the outer surface of the insulation assembly 160, so that the invention is not limited to the annular groove 160b of the embodiment.

As shown in FIG. 4, in the embodiment, the insulation assembly 160 further includes an insulation locking ring 163, where the insulation locking ring 163 is a protrusion structure disposed in a perforation 152 of the cathode clamp 150, and the insulation lock ring 163 is fixed in the perforation 152 through a protrusion portion 152a in a radial direction of the perforation 152. A locking member 170 respectively and sequentially penetrates through the insulation locking ring 163, the second component 162 of the insulation assembly 160, the first component 161 of the insulation assembly 160, the filament clamp 130 and a fixing plate 131 of the filament clamp 130.

In detail, the second component 162 of the insulation assembly 160 has a through hole 162c, and a part of the insulation locking ring 163 is stretched into the through hole 162c of the second component 162. The filament clamp 130 and the fixing plate 131 have a first screw hole T1, the first component 161 has a second screw hole T2 corresponding to the first screw hole T1, and the insulation locking ring 163 has a third screw hole T3 corresponding to the second screw hole T2. The locking member 170 is respectively locked to the first screw hole T1, the second screw hole T2 and the third screw hole T3 in assembling. In the embodiment, the insulation locking ring 163, the first component 161 and the second component 162 of the insulation assembly 160 wrap the locking member 170, and electrical connection between the filament clamp 130 and the cathode clamp 150 through the locking member 170 is avoided through the insulation assembly 160. Meanwhile, such tight configuration enhances locking rigidity of the filament clamp 130, the insulation assembly 160 and the cathode clamp 150 combined with each other. However, the screw holes may be only configured on the filament clamp 130 and the fixing plate 131 as long as the strength of the combination is ensured, which is not limited by the invention.

Moreover, in the embodiment, as shown in FIG. 6, a gap G may be designed between the side surface 162b of the second component 162 and the encircling wall 161c of the first component 161, and the gap G is connected to the annular groove 160b. Based on such design, the ion beam is hard to enter the gap G, which further decreases the possibility that the ion beam is deposited on the whole surface of the insulation assembly 160 to cause the electrical conduction between the filament clamp 130 and the cathode clamp 150.

In summary, in the ion source head structure of the semiconductor ion implanter of the invention, while the insulation assembly insulates the filament clamp and the cathode clamp, since the surface of the insulation assembly has the step difference, the ion beam generated by the ion source head structure of the semiconductor ion implanter is hard to enter the depression formed by the step difference, so as to decrease a replacing frequency of the insulation assembly and meanwhile reduce the equipment and labor cost for replacing the insulation assembly.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An ion source head structure of a semiconductor ion implanter, comprising:
   a filament;
   a filament clamp, clamping the filament;
   a cathode, presenting a shell shape and having a receiving space, wherein the filament is located in the receiving space;
   a cathode clamp, clamping the cathode; and
   an insulation assembly, disposed between the filament clamp and the cathode clamp such that the filament clamp is insulated from the cathode clamp, the insulation assembly having a first surface, a second surface opposite to the first surface, and an outer surface between the first surface and the second surface, wherein the first surface of the insulation assembly is in contact with the filament clamp, the second surface of the insulation assembly is in contact with the cathode clamp, and a step difference exists on the outer surface of the insulation assembly.

2. The ion source head structure of the semiconductor ion implanter as claimed in claim 1, wherein the insulation assembly has an annular groove recessed on the outer surface to form the step difference.

3. The ion source head structure of the semiconductor ion implanter as claimed in claim 1, wherein the annular groove is formed on the outer surface at a portion close to the second surface.

4. The ion source head structure of the semiconductor ion implanter as claimed in claim 1, wherein the insulation assembly comprises a first component and a second component, the first component has a bottom and an encircling wall extending from the bottom, and the second component is disposed on the bottom and located in the encircling wall, and a height of the second component is greater than a height of the encircling wall.

5. The ion source head structure of the semiconductor ion implanter as claimed in claim 4, wherein the first surface of the insulation assembly is located on the first component, the second surface of the insulation assembly is located on the second component, and the annular groove is formed between the first component and the cathode clamp.

6. The ion source head structure of the semiconductor ion implanter as claimed in claim 5, wherein a gap exists between a side surface of the second component and the encircling wall, and the gap is connected to the annular groove.

7. The ion source head structure of the semiconductor ion implanter as claimed in claim 1, wherein the insulation assembly is an integrally formed structure.

8. The ion source head structure of the semiconductor ion implanter as claimed in claim 1, wherein the insulation assembly further comprises an insulation locking ring disposed in a perforation of the cathode clamp, and a locking member respectively and sequentially penetrates through the insulation locking ring, the insulation assembly and the filament clamp, and is at least screwed to the filament clamp.

9. The ion source head structure of the semiconductor ion implanter as claimed in claim 8, wherein the insulation assembly comprises a first component and a second component stacked on the first component, the second component has a through hole, and a part of the insulation locking ring is stretched into the through hole of the second component.

10. The ion source head structure of the semiconductor ion implanter as claimed in claim 8, wherein the filament clamp has a first screw hole, the first component has a second screw hole corresponding to the first screw hole, and the insulation locking ring has a third screw hole corresponding to the second screw hole, and the locking member is respectively locked to the first screw hole, the second screw hole and the third screw hole.

* * * * *